(12) United States Patent
Nagao et al.

(10) Patent No.: US 8,443,131 B2
(45) Date of Patent: May 14, 2013

(54) NON-VOLATILE MEMORY DEVICE

(75) Inventors: Mitsuhiro Nagao, Kasugai (JP); Kenta Kato, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 828 days.

(21) Appl. No.: 11/259,874

(22) Filed: Oct. 26, 2005

(65) Prior Publication Data
US 2006/0101301 A1 May 11, 2006

Related U.S. Application Data

(63) Continuation of application No. PCT/JP2004/015833, filed on Oct. 26, 2004.

(51) Int. Cl.
| | |
|---|---|
| G06F 12/00 | (2006.01) |
| G06F 13/00 | (2006.01) |
| G06F 13/28 | (2006.01) |
| G11C 11/34 | (2006.01) |
| G11C 16/04 | (2006.01) |
| G11C 7/10 | (2006.01) |

(52) U.S. Cl.
USPC .. 711/103; 711/115; 365/185.01; 365/189.05

(58) Field of Classification Search .......... 711/103–105, 711/163, 165
See application file for complete search history.

(56) References Cited

U.S. PATENT DOCUMENTS

| | | | |
|---|---|---|---|
| 6,088,281 A | 7/2000 | Miyakawa et al. | |
| 6,108,264 A * | 8/2000 | Takahashi et al. | 365/230.03 |
| 6,167,338 A * | 12/2000 | De Wille et al. | 701/51 |
| 6,215,717 B1 | 4/2001 | Takeguchi et al. | |
| 6,401,163 B1 * | 6/2002 | Kondo et al. | 711/100 |
| 6,462,985 B2 | 10/2002 | Hosono et al. | |
| 6,556,479 B2 * | 4/2003 | Makuta et al. | 365/185.09 |
| 7,869,275 B2 * | 1/2011 | Grant et al. | 365/185.08 |
| 2001/0003509 A1 | 6/2001 | Hosono et al. | |
| 2002/0186589 A1 * | 12/2002 | Makuta et al. | 365/185.09 |
| 2003/0149851 A1 * | 8/2003 | Shiota et al. | 711/163 |
| 2003/0231522 A1 | 12/2003 | Watanabe | |

FOREIGN PATENT DOCUMENTS

| | | |
|---|---|---|
| JP | 2001-176290 | 6/2001 |
| JP | 2001-273781 | 10/2001 |
| JP | 2004-259385 | 9/2004 |

OTHER PUBLICATIONS

Pat. Abstract of JP (2001-176290), Jun. 29, 2001, Toshiba Corp.

* cited by examiner

Primary Examiner — Yaima Campos

(57) ABSTRACT

Operational information read out by a read-out sense amplifier (19) is transferred via the data line DB to a volatile memory section. The volatile memory section is configured with the volatile memory section (21) having a SRAM configuration and the second volatile memory section (23) configured with latch circuits, both sections respectively connected in parallel with the data line DB. The operational information, which may be provided depending on an operation state of the write-protect information and other information stored in the non-volatile memory cell MC selected by the word line WLWP, is written and read out with respect to the first volatile memory section (21) in response to the identification information linked with the operational information. The operational information which must be constantly accessible, is written into the second volatile memory section (23). Thus, the operational information is available in response to attributes of the operational information.

18 Claims, 10 Drawing Sheets

FIG. 5

| IDENTIFICATION NUMBER | 0 ~ 15 | 16 ~ 31 | 32 ~ 47 | 48 ~ 63 | 64 ~ 79 | 80 ~ 95 | 96 ~ 111 | 112 ~ 127 |
|---|---|---|---|---|---|---|---|---|

| SEL_Y(I) | 0 | 1 | 2 | 3 | 4 | 5 | 6 | 7 |
|---|---|---|---|---|---|---|---|---|
| SA(6) | 0 | 0 | 0 | 0 | 1 | 1 | 1 | 1 |
| SA(5) | 0 | 0 | 1 | 1 | 0 | 0 | 1 | 1 |
| SA(4) | 0 | 1 | 0 | 1 | 0 | 1 | 0 | 1 |

| SEL_G(J) | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| SA(3) | 0 | 0 | 0 | 0 | 0 | 0 | 0 | 0 | 1 | 1 | 1 | 1 | 1 | 1 | 1 | 1 |
| SA(2) | 0 | 0 | 0 | 0 | 1 | 1 | 1 | 1 | 0 | 0 | 0 | 0 | 1 | 1 | 1 | 1 |
| SA(1) | 0 | 0 | 1 | 1 | 0 | 0 | 1 | 1 | 0 | 0 | 1 | 1 | 0 | 0 | 1 | 1 |
| SA(0) | 0 | 1 | 0 | 1 | 0 | 1 | 0 | 1 | 0 | 1 | 0 | 1 | 0 | 1 | 0 | 1 |

NON-VOLATILE MEMORY DEVICE

CROSS-REFERENCES TO RELATED APPLICATIONS

This is a continuation of International Application No. PCT/JP2004/015833, filed Oct. 26, 2004 which was not published in English under PCT Article 21(2).

TECHNICAL FIELD

The present invention relates to a non-volatile memory device in which operational information is stored and, in particular, relates to a non-volatile memory device having multiple volatile memory sections for storing different types of operational information in a referable state.

BACKGROUND OF THE INVENTION

In the non-volatile semiconductor memory device disclosed in Japanese Unexamined Patent Publication No. 2001-176290 (Patent Document 1), as shown in FIG. 9, an initialization data region 130 of a memory cell array 110 is provided in a cell block, a minimum unit of data erase. The initialization data region 130 is predefined as a region to write initialization data for determining operating conditions of the memory.

A power-on reset circuit 270 detects power-on and, in response to detecting power-on, generates and provides a power-on detected signal to a control circuit 210. The control circuit 210 sets operation setoff the semiconductor memory device into a read-out mode a predetermined waiting time after power-on is detected to allow for stabilization of the power. Internal addresses are then sequentially incremented from an address register 220 and output to a row decoder 140 and a column decoder 170. Then, data in the initialization data region 130 is selected by the row decoder 140 and the column decoder 170, read out by a sense amplifier circuit 150, and transferred to and retained in a data register 160. The data is further transferred via a data bus to initialization data latch circuits 230 and 250 and a chip information data latch circuit 280 and retained therein.

The initialization data latch circuit 230 is configured with latch circuits LA1 to Lam, as shown in FIG. 10, where m is an integer related to the storage capabilities of the semiconductor memory device. The respective latch circuits LA are individually provided with a clocked inverter 410 for taking in a latch signal 420 and data. The initialization data latch circuit 250 and the chip information data latch circuit 280 are configured similarly.

Problems to Be Solved by the Invention

In a non-volatile memory device, it is necessary to store the write-protect information for determining whether memory cell groups such as sectors and sector groups are rewritable or not is stored in a non-volatile memory region of the non-volatile memory device in addition to initialization data (such as the redundant and trimming information stored in the initialization data region 130 of the semiconductor memory device of Patent Document 1). Such predefined information must be read out in response to detection of power-on and thereafter retained in an available state in a volatile memory region.

Typically, initialization data such as redundant and trimming information is factory-installed operational information predefined for each non-volatile memory device. Redundant information is address information identifying defective memory cells or information for switching an access operation to redundant memory cells when the address information for such access operation agrees with the redundant information. Trimming information is information for adjusting an operational state of an internal circuit, such as adjusting a voltage value output from an internal voltage-generating circuit or operation timing for various control circuits. Such operational information is read out from the initialization data region 130 of the memory cell array 110 upon detection of power-on or initialization and thereafter must be constantly available by the internal circuit while the non-volatile memory device is in an active state. Therefore, read-out operational information is thereafter retained in a volatile memory region configured with latch circuit LA in order to be constantly accessible from the initialization data latch circuits 230 and 250 and the chip information data latch circuit 280.

In contrast, the write-protect function is a function for determining whether each memory cell group, such as a memory sector, is rewritable or not. Furthermore, the write-protect information is operational information definable by users. Thus, the write-protect information which indicates whether a memory cell to be accessed belongs to a rewritable memory cell group or not should be capable of read-out whenever necessary to determine whether a memory sector is write-protected in response to an input for rewritable access to a memory cell. It is not necessary that the write-protect information be kept constantly accessible while a non-volatile memory device is active. It is merely sufficient that such information is accessible when judging whether a memory cell or a memory sector is rewritable or not in response to an input requesting rewritable access.

Therefore, it is disadvantageous to retain operational information, such as write-protect information which is required only for specific functions, in a volatile memory region similar in configuration to the initialization data latch circuits 230 and 250 and the chip information data latch circuit 280, because requiring volatile storage space for such information increases the circuit size requirements of the data latch circuits 230, 250, 280, by requiring provision and configuration of latch circuit LA and other components of the data latch circuits 230, 250, 280. Namely, initialization data latch circuits 230, 250 and chip information data latch circuit 280 are configured after an electric current capacity is secured to maintain the ability to constantly refer to such internal circuits. Even though operational information such as write-protect information is not required to be constantly referable, the circuit nevertheless has increased size requirements to enable electric current capacity for accessing such information, thereby posing problems.

As the capacity of non-volatile memory devices increases, the number of memory sectors where rewritability is to be controlled may also increase. Thus, the amount of write-protect information required will also increase. A volatile memory region for retaining the additional write-protect information will also be required to obtain electric current and space savings. However, circuits configured in a volatile memory region in accordance with the above-described prior art methodology cannot solve the problem of increased space due to the increased write-protect information.

SUMMARY OF THE INVENTION

The present invention has been made to solve at least one problem in the above-described prior art and to provide a non-volatile memory device having a non-volatile memory region and a volatile memory region; more particularly, the present invention provides a volatile memory region wherein operational information stored in the non-volatile memory region can be read out from the non-volatile memory region in response to power-on or upon initialization and, thereafter, retained in the volatile memory region. In accordance with the present invention, the operational information can be retained in a manner such that the operational information may be advantageously referred to depending on the attributes of the operational information.

The non-volatile memory device in accordance with the present invention includes a volatile memory section which stores operational information while power is being supplied, the volatile memory section including a first volatile memory section which controls read-out of the operational information stored in response to identification information linked with the operational information and a second volatile memory section which constantly outputs the operational information in logically processable form regardless of the identification information.

A non-volatile memory device in accordance with the present invention is also provided which includes a volatile memory section in which operational information is stored while power is supplied. The volatile memory section is provided with a first volatile memory section and a second volatile memory section. The stored operational information is read out from the first volatile memory section in response to the identification information linked with the operational information. In the second volatile memory section, the stored operational information is constantly output in a logically processable form, regardless of the identification information.

Therefore, the operational information is stored in the volatile memory section while the non-volatile memory device is in an active state and a volatile memory section can be selected from the first or the second volatile memory section for storing the operational information. The first and second volatile memory sections differ in read-out characteristics and the operational information may be stored in either the first or second volatile memory section in accordance with the manner in which the operational information will be accessed. Namely, operational information which need only be accessed in accordance with an operation state that can be identified in response to the identification information linked with the operational information can be stored in the first volatile memory section. On the other hand, operational information which must be constantly referred to while power is supplied in order for proper operation of the circuit can be stored in the second volatile memory section.

Since the first volatile memory section is configured to output the operational information selected in response to the identification information, only a logical value of the operational information related to the identification information need be accessed, thereby reducing the electric current requirements of the first volatile memory section and eliminating a necessity for keeping an active logically-processable electric current reserved for driving the first volatile memory section. It is therefore possible to commonly use output circuits necessary for reading out the selected operational information such as control circuits and driving circuits, thereby allowing the first volatile memory section to be configured with compact-sized circuits. It also advantageously allows the storing of large-volume operational information in the first volatile memory section.

In addition, since the second volatile memory section outputs operational information and has a sufficient electric current-driving capacity reserved therefore so as to constantly attain logical processing, it is possible to use the output from the second volatile memory section as is and execute an operation internal to the volatile memory section when reference is made to the non-volatile memory device. Since no prior processing such as special selection operation, amplification or waveform shaping is necessary for reading the operational information from the second volatile memory section, the operational information can be provided instantaneously.

Effects of the Invention

In accordance with the present invention, the non-volatile memory device for reading out the previously-stored operational information and transferring it to the volatile memory section for retention is provided with the first volatile memory section configured with compact-sized circuits selected depending on the identification information and the second volatile memory section configured with a sufficient electric current-driving capacity so as to constantly conduct logical processing, thereby making it possible to store the operational information in a desirable volatile memory section depending on the attributes of the operational information. It is also possible to drastically reduce the size of the region of the volatile memory section which stores operational information.

BRIEF DESCRIPTION OF DRAWINGS

FIG. 5 depicts an allocation table of address information depending on identification information as used in the non-volatile memory device of FIG. 1 in accordance with the present embodiment;

DETAILED DESCRIPTION OF THE INVENTION

Figure 1:
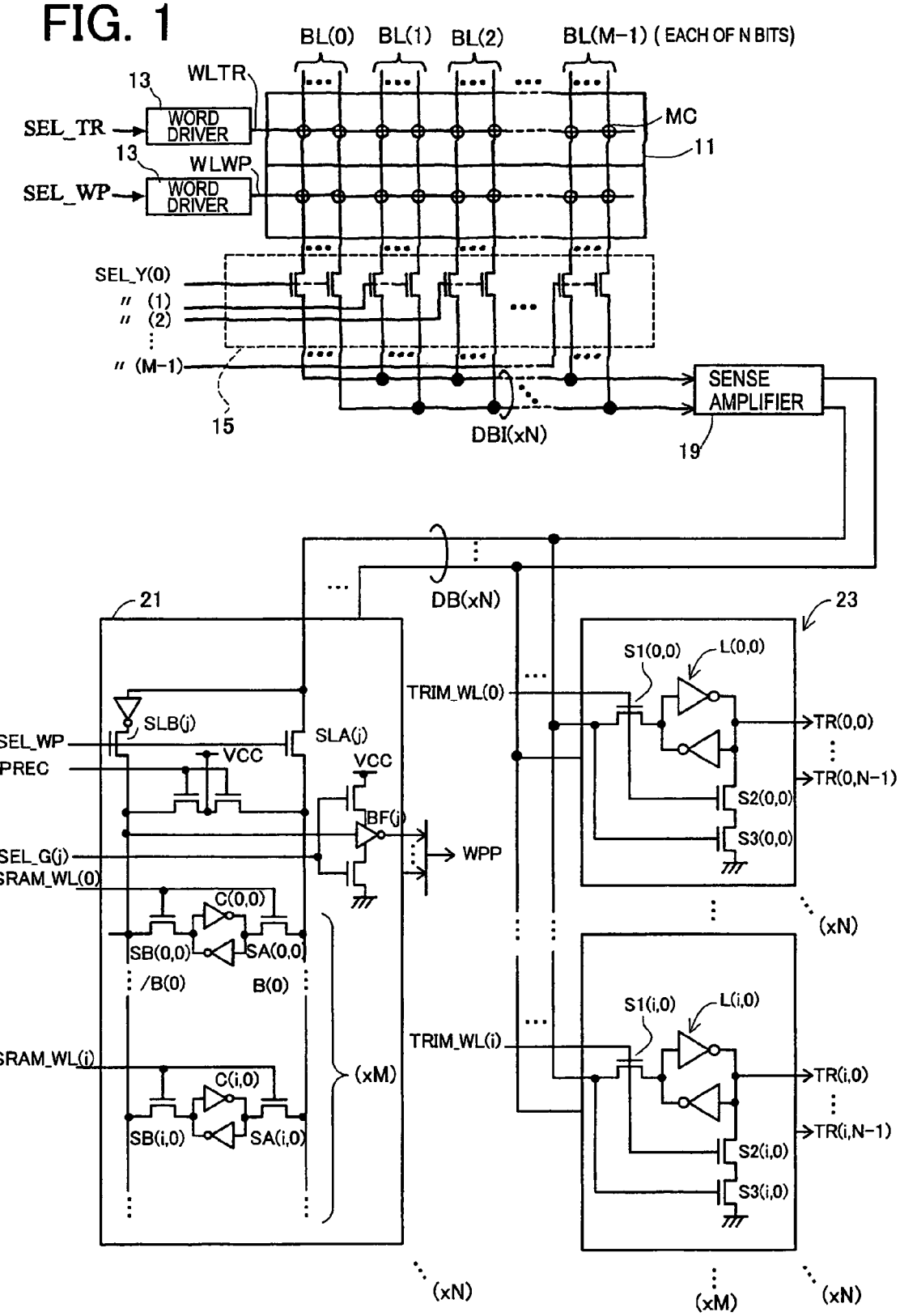
FIG. 1 is a circuit diagram of portions of a non-volatile memory device in accordance with a present embodiment.

Hereinafter, a detailed explanation of specific embodiments of a non-volatile memory device in accordance with the present invention will be presented with reference to FIGS. 1 to 8 and 11.

In a non-volatile memory device, operating conditions in operating circuits are defined in accordance with various types of operational information. The operational information is mainly classified into two types.

The first type of operational information is information set by vendors before shipment of the products. This information is necessary for allowing a non-volatile memory device to execute certain operations and includes information for adjusting bias voltage values which are used in various operations such as program operations, erase operations and read-out operations; information for adjusting the operation timing of various operations; information for adjusting the oscillation frequency of built-in oscillators; and redundant address information for accessing redundant memory cells instead of defective memory cells. This first type of operational information will be defined during testing processes at a vendor before shipment of the semiconductor memory products.

The second type of operational information is information set by users in accordance with their use conditions. This information is necessary for customizing a non-volatile memory device in accordance with assembled system functions. For example, where memory cell arrays of a non-volatile memory device are partitioned for each predetermined region, the operational information can identify whether each such partitioned region is rewritable or not and can set the write-protect function for memory cell groups such as a memory sector or a sector group. It is also possible to identify whether operational information pre-stored in a non-volatile memory section is rewritable or not. When it is desired to restrict the user's degree of freedom, a function can be set that makes the information rewritable only by accepting input of a certain code. In this case, users can set both the function and the predetermined code.

In a non-volatile memory device, it is necessary that the above-described operational information be retained after power-off. Unless the first type of operational information is retained, factory-installed circuit operations cannot be maintained and defects may result in decreased operational performance or operational failure. Further, unless the second type of operational information is retained, it may be impossible to maintain the performance and the function expected for a system equipped with a non-volatile memory device. Therefore, the operational information set by vendors and/or users must be stored in a non-volatile memory section provided inside the non-volatile memory device.

The operational information stored in the non-volatile memory section is accessed in accordance with the operation state of the non-volatile memory device to realize a desired circuit operation.

The first type of operational information is information that should be promptly accessed in response to power-on for a desired operating condition to be determined for the non-volatile memory device. A number of various circuits must be accessed without delay in response to power-on so that internal voltage-generating circuits, various timing circuits, built-in oscillators, etc., can be provided with an adjusted voltage value, operation timing and oscillation frequency. Further, it is preferable that the redundant address information be provided without delay so that a judgment on whether redundancy should be saved or not in response to inputted address information can be made, and it is necessary that the redundant address information be provided without delay for defective memory cells in response to power-on.

The second type of operational information is information which determines an operational state of the non-volatile memory device. This information is appropriately set in accordance with internal operations and provides predetermined circuit operations.

Due to the above-described circumstances, a non-volatile memory device may have a two-stage structure including a non-volatile memory section and a volatile memory section for storing the operational information. The non-volatile memory section is provided to store the operational information in a manner such that the operational information may not be lost after power-off. The operational information is transferred from the non-volatile memory section to the volatile memory section for storing therein at power-on so that the operational information can be accessed without delay to cope with internal operations during power-on and thereafter during operation of the non-volatile memory device. Such transfer is executed in response to power-on or in response to a reset operation for initializing the non-volatile memory device. During power-on, various operating conditions are determined based on the operational information stored in the volatile memory section. Further, in a case where the operational information stored in the non-volatile memory section is updated (changed) during power-on, operational information (update information) input from sources other than the non-volatile memory device is stored in the non-volatile memory section prior to update of contents of the volatile memory section. Therefore, in a case where the operational information is updated during power-on, various operating conditions will be determined on the basis of the operational information of the updated volatile memory section.

In addition, it is preferable that the volatile memory section consists of two types of structures depending on the attributes of the operational information to be stored. Namely, it is preferable that the first type of operational information be immediately accessible in response to power-on and it is necessary for determining the operating conditions of the non-volatile memory device that the first type of operational information be stored in a constantly accessible state during operation of the non-volatile memory device. In contrast, it is preferable that the second type of operational information be available in response to the operation state of the non-volatile memory device and, in order to execute various predetermined internal operations, the second type of operational information should be retrievable whenever necessary.

Thus, the volatile memory section for storing the first type of operational information is the second volatile memory section configured with a latch circuit, a register circuit, and other circuits. Such a configuration makes it possible that the latch circuit and the register circuit are arranged in close proximity to the circuit block which requires that the operational information be read out constantly and at high speeds. In addition, the second type of operational information is stored in the first volatile memory section wherein volatile memory cells are provided in an array form and a RAM configuration is provided so that data is read out and stored in accordance with an address assignment. It is, therefore, possible to read out the operational information required in response to an operational state.

The embodiment of FIG. 1 shows a circuit configuration in which the operational information stored in the non-volatile memory section 11 is transferred to two types of volatile memory sections for storing in accordance with the operational information to be stored. The first type of operational information must be immediately accessible in response to power-on and is necessary for determining the operating conditions of the non-volatile memory device. Accordingly, this first type of operational information is stored in the second volatile memory section 23 configured with a latch circuit and other circuits. The second type of operational information for executing predetermined internal operations depending on an operational state is stored in the first volatile memory section 21 in which volatile memory cells are provided in an array and read-out and writing functions can be executed in accordance with an address assignment. Here, the array is a configuration provided with volatile memory cells developed in a matrix in individual directions defined by the word-line and bit-line directions and arranged at each point where a word line intersects with a bit line, as with non-volatile memory section 11. Individual volatile memory cells are selected in response to an address. In accordance with the present invention, the array 21 may also comprise volatile memory cells arranged in only one direction, such as either in the word-line direction or the bit-line direction.

A non-volatile memory section 11 is configured by arraying non-volatile memory cells MC in a matrix in the row direction and the column direction. Plural non-volatile memory cells MC are selected and controlled by word lines WLTR and WLWP driven by word drivers 13 which are aligned and arranged in the row direction. In the embodiment of the present invention, the word drivers 13 are controlled by selection signals SEL_TR and SEL_WP. For example, the word line WLTR is activated by the selection signal SEL_TR and trimming information for adjusting operating conditions of internal circuits is stored in the non-volatile memory cell MC selected by the word line WLTR. Similarly, the word line WLWP is activated by the selection signal SEL_WP, and write-protect information to determine whether the information is rewritable or not by each predetermined region (not illustrated) of the memory cell array configured by sectors or other defined regions of the non-volatile memory cell array to which users have access (non-volatile memory cells in an addressable region of the memory cell array requested by an ordinary user), is stored in the non-volatile memory cell MC selected by the word line WLWP. The selection signals SEL_TR and SEL_WP are activated for access to the non-volatile memory cell MC in the non-volatile memory section 11.

Non-volatile memory cells MC of the same column are connected by one of the bit lines in the column direction. These bit lines configure a basic unit of access for each of N-numbered lines as bit line groups of BL(0) to BL(M−1). The bit line groups of BL(0) to BL(M−1) are connected to N bit-wide internal data lines DBI via Y decoder 15. The Y decoder 15 is configured with NMOS transistor groups between the N bit-wide internal data lines DBI for each of the bit line groups BL(0) to BL(M−1). NMOS transistor groups of the Y decoder 15 are conductively controlled by the Y decode signals SEL_Y(0) to SEL_Y(M−1) for each NMOS transistor group. Any set of the bit line groups of BL(0) to BL(M−1) is connected to the internal data line DBI.

The internal data line DBI is connected to the read-out sense amplifier 19 for reading-out data and also for writing data which is input from a data terminal (not illustrated) via a bias control circuit (not illustrated).

As is well known to those skilled in the art, the bias control circuit is a conventional control circuit for indicating whether the operational mode when rewriting is based on the program operation or an erasing operation in response to program-indicating signals or erase-indicating signals output from a command decoder and applying bias to the non-volatile memory cell MC. Externally-input command signals are input to the command decoder and the command signals are decoded in response thereto in order to output the program-indicating signals and the erase-indicating signals. The non-volatile memory cell array to which users also have access is inclusive with bit line group BL(i) (i=0 or M−1) which is the same as the non-volatile memory section 11 in which the operational information is stored and configured in an array form. The non-volatile memory section 11 is not assigned an address for rewritable access or read-out access to data by users.

The program operation determines a bit position for executing the program operation in response to inputted address signals and applies bias to the corresponding internal data line DBI. The erasing operation provides a batch erase to sectors or other memory regions in response to the inputted address signal. For example, bias is commonly applied to N bit-wide internal data lines DBI. In the case where the write-protect function is activated, judgment is made whether a region indicated by the input address signal is rewritable or not prior to applying bias to the program operation or the erasing operation, as will be described later.

Data on the operational information read out by the read-out sense amplifier 19 is transferred to the volatile memory section via the data line DB. The volatile memory section is made up of the first volatile memory section 21 configured in the above-described array form and the second volatile memory section 23 configured with latch circuits, both of which are respectively connected to the data line DB in parallel. Write-protect information (i.e., the second type of operational information stored in the non-volatile memory cell MC selected by the word line WLWP) is transferred to the first volatile memory section 21, and trimming information (i.e., the first type of operational information stored in the non-volatile memory cell MC selected by the word line WLTR) is transferred to the second volatile memory section 23.

The first volatile memory section 21 is configured in an array form as described above and provided with N pairs of bit line pairs B(j), /B(j) (j=0 to N−1) in response to N-numbered data lines DB, and M-numbered word lines SRAM_WL(i) (i=0 to M−1).

Volatile memory cells are arranged at each point where word lines SRAM_WL(i) intersect with bit line pairs B(j) and /B(j). Volatile memory cells are provided between memory circuits C(i, j) ((i=0 to M−1, j=0 to N−1) configured with latch circuits for storing bit data and bit line pairs B(j) and /B(j). These memory cells are also provided with selection switch pairs SA(i, j), SB(i, j) ((i=0 to M−1 and j=0 to N−1) conductively controlled by the word line SRAM_WL(i).

The data line DB, via a pair of selection switches SLA(j) and SLB(j) (j=0 to N−1), is connected to the bit line B(j) and, after being inverted by an inverter gate, is connected to the bit line /B(j). Selection switches SLA(j) and SLB(j) are activated by the selection signal SEL_WP. The write-protect information is read out of the bit line group BL(i) (i=0 to M−1) of the non-volatile memory cells MC connected to the word line WLWP in response to the selection signal SEL_WP. Any one of Y decode signals SEL_Y(i) (i=0 to M−1) is activated in this state and the write-protect information read out of any one of the bit line group BL (i) is provided to the data line DB via the internal data line DBI and the read-out sense amplifier 19. Since selection switches SLA(j) and SLB(j) are activated by the selection signal SEL_WP in the first volatile memory section 21, any one of the bit line groups BL(i) selected by any one of Y decode signals SEL_Y(i) is selected, and the write-protect information stored in the corresponding non-volatile memory cells MC is transferred to the first volatile memory section 21.

In the decode circuit (FIG. 2) to be described later, address decode signals SEL_S(i) correspond to word lines SRAM_WL(i). Any one of the corresponding word lines SRAM_

WL(i) is activated in response to any one of the address decode signals SEL_S(i), and the write-protect information transferred to the bit line pairs B(j) and /B(j) is stored in the corresponding volatile memory circuit C(i, j) (j=0 to N−1).

The write-protect information stored in the first volatile memory section 21 is read out when address signals are input to the non-volatile memory cell array in response to an external access by the above-described users. The address signals for the non-volatile memory cell to be accessed (or at least a section of the address showing sectors or other memory regions to which the non-volatile memory cell belongs) is decoded by a decode circuit to be described later in FIG. 2. Any one of the word lines SRAM_WL(i) is selected by such decode function and the selection signal SEL_G(j) is further selected. In response to selection of the word line SRAM_WL(i), information is read out into each bit line pair B(j) and /B(j). Thereafter, the selection signal SEL_G(j) is selected and, in response thereto, any one of the bit line pairs is then selected, thereby reading out the write-protect information stored therein. Thus read-out of write-protect information is subjected to a wired-OR configuration and logical add (OR operation), and then output as the write-protect signal WPP.

Namely, each bit line /B(j) has been input into a tri-state buffer circuit BF(j) (j=0 to N−1) and information read out from the bit line /B(j) is inverted and output according to activation of selection signal SEL_G(j).

Further, NMOS transistors individually provided between supply voltage VCC and bit lines B(j) and /B(j) are conductively controlled by a pre-charge signal PREC. The pre-charge circuit is connected in the vicinity of the supply voltage VCC creating shorts to the bit line pairs in response to the pre-charge signal PREC. The present invention is not limited to this pre-charge system but may include any system in which the pre-charge voltage of the data line DB is adjustable.

The first volatile memory section 21 is provided with the above-described array configuration and the word line SRAM_WL(i) and the selection signal SEL_G(j) are selected depending on address signals indicating the non-volatile memory cell to be accessed which is input when rewrite access to the non-volatile memory device is requested. Write-protect information on sectors or other memory regions, including corresponding addresses, is read out as the write protect signal WPP. Judgment is made whether or not the rewrite access is authorized depending on the write protect signal WPP.

The second volatile memory section 23 having the latch circuit configuration includes the latch circuits L(i, j) (i=0 to M−1 and j=0 to N−1) configured in response to M-numbered word lines TRIM_WL(i) (i=0 to M−1) and N-numbered data lines DB.

Further, latch circuits L(i, j) having the respective i values of 0 to M−1 are configured with N-numbers and connected to N-numbered data lines DB via write-selection switches S1(i, j) connected to word lines TRIM_WL(i) having the respective i values of 0 to M−1.

An inversion node between the write-selection switch S1(i, j) and the latch circuit L(i, j) is inverted via an inverter gate and provided with the output trimming signal TR(i, j) (I=0 to M−1 and j=0 to N−1). Further, selection switch S2(i, j) is connected to the word line TRIM_WL(i) in the same manner as write-selection switch S1(i, j). Selection switch S2(i, j) and the low-level compensating switch S3 (i, j) are connected to the corresponding data line DB and connected in series to a ground potential. The latch circuits L(i, j) must be stably inverted in response to power-on so that the power-on signal may not destabilize an operation for reading out the first operational information, the method of which may include an addition of reset elements to at least either the input side or the output side of the latch circuits L(i, j) or stable adjustment of the latch circuit ratio.

The decode circuit to be described later (FIG. 3) activates the corresponding word line TRIM_WL(i) in response to Y decode signals SEL_Y(i). Trimming information read out in the data line DB in response to any one of Y decode signals SEL_Y(i) is written into the latch circuits L(i, j) and stored therein via the write selection switch S1(i, j) conducted and written by the corresponding activated word line TRIM_WL(i).

At this time, the write-selection switch S2(i, j) is also in a conductive state. When high-level trimming information is input via the write-selection switch S1(i, j) configured with an NMOS transistor, the voltage to be input into the latch circuit L(i, j) will reduce to a level that corresponds to the threshold voltage due to the operational characteristics of an NMOS transistor. In order to compensate for such voltage reduction and acceleration latches on the latch circuit L(i, j), the write-selection switch S2(i, j) is connected in series with a low-level compensating switch S3(i, j). The low-level compensating switch S3 (i, j) is activated in response to high-level trimming information, and an inversion node of the latch circuits L(i, j) can be drawn to a low level in association with the write-selection switch S2 (i, j) being in a conductive state by the word line TRIM_WL(i). In addition, the latch operation can be accelerated and the node drawn to a high level via the write-selection switch S1(i, j).

Alternatively, where the write-selection switch S1(i, j) is configured with a PMOS transistor connected in parallel with an NMOS transistor in a transfer gate configuration, the write-selection switch S2(i, j) and the low-level compensating switch S3(i, j) are not required.

Trimming information written in each latch circuit L(i, j) of the second volatile memory section 23 is stored while the trimming information TR(i, j) is constantly output via an inverter gate. Since the latch circuit L(i, j) and/or the subsequent inverter gate are provided with a sufficient electric current-driving capacity, internal circuits of the non-volatile memory device are able to constantly utilize the trimming information.

In FIG. 1, i (=0 to M−1) represents the number of bit line groups BL(i). The configuration can, for example, be made with 8 groups (M=8). In addition, j (=0 to N−1) represents a bit width of bit lines constituting the bit line groups, or a bit width of the internal data line DBI and the data line DB. The data line configuration can be made, for example, with 16 bit widths (N=16).

Figure 2:
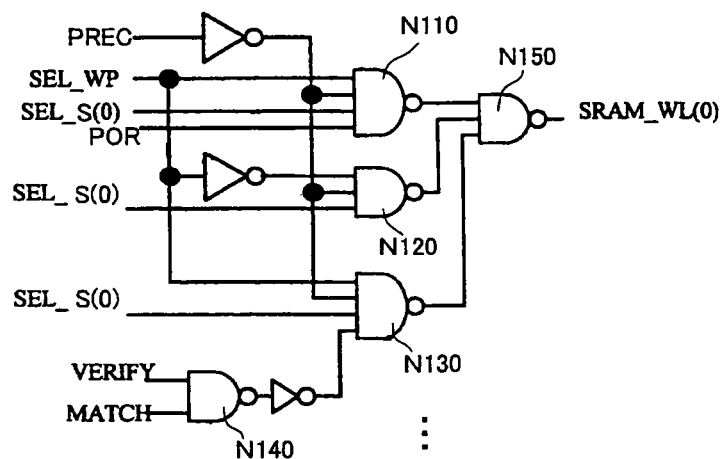
FIG. 2 is a circuit diagram illustrating decode circuits (i=0 to 7) in a first volatile memory section of the non-volatile memory device of FIG. 1 in accordance with the present embodiment.
Figure 2:
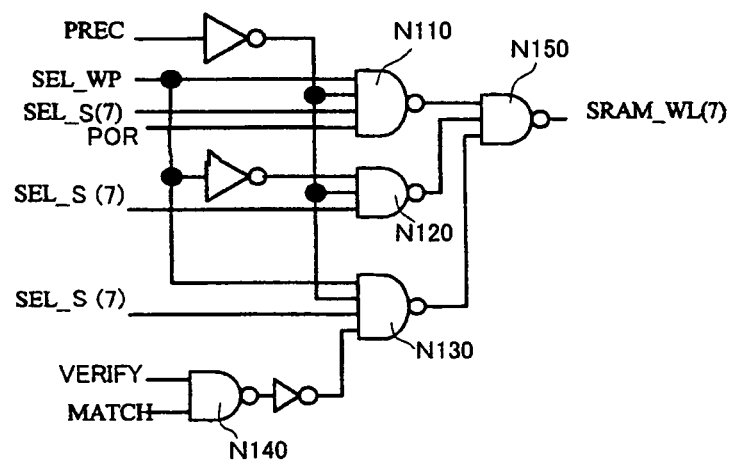
Figure 3:
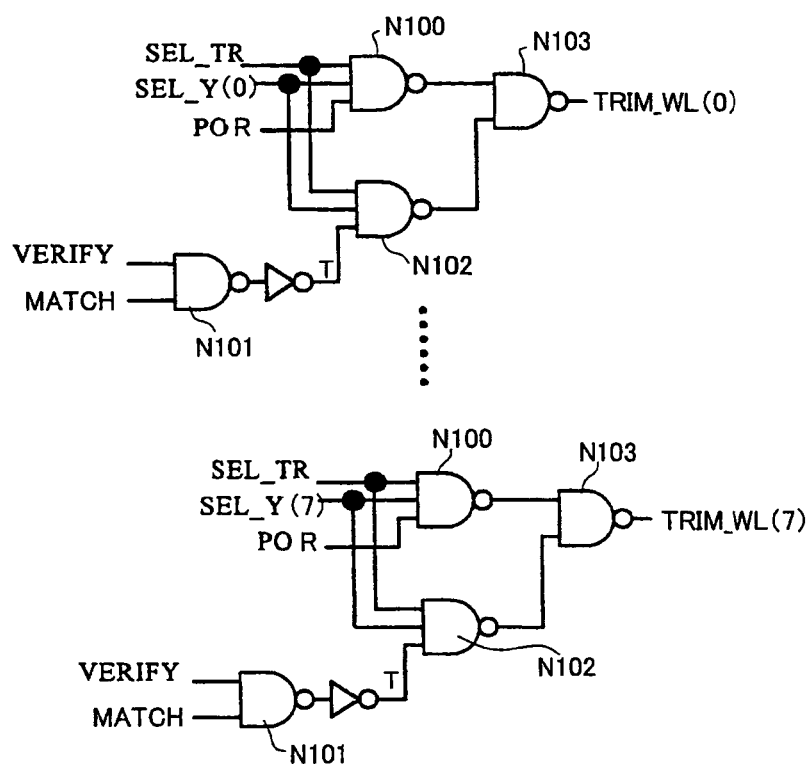
FIG. 3 is a circuit diagram illustrating decode circuits (i=0 to 7) in a second volatile memory section of the non-volatile memory device of FIG. 1 in accordance with the present embodiment.
Figure 4:
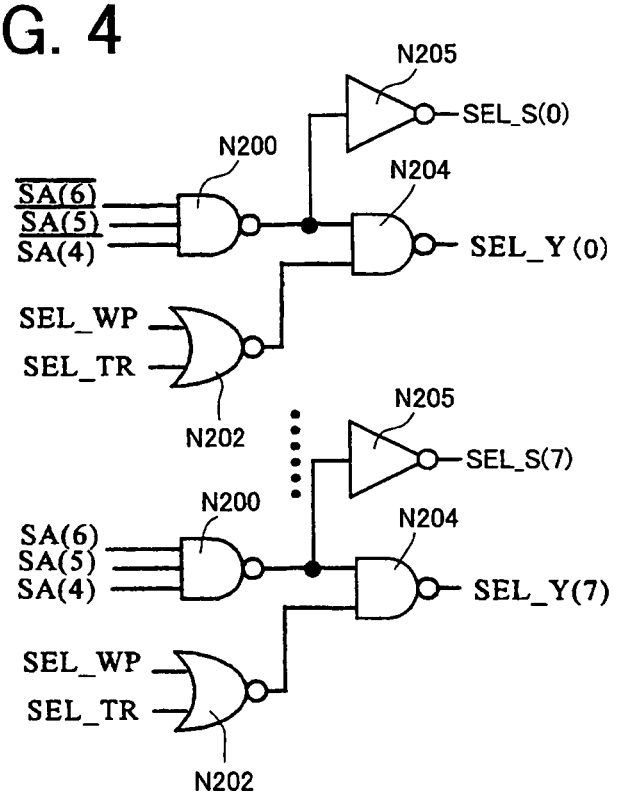
FIG. 4 is a circuit diagram illustrating pre-decoded circuits of the non-volatile memory device of FIG. 1 in accordance with the present embodiment.

FIGS. 2 to 4 show examples of the decoder circuit (in a case of M=8). FIG. 1 shows a circuit for outputting the word lines SRAM_WL(I) and TRIM_WL(I) (I=0 to 7). The word line SRAM_WL(I) is activated when write-protect information is written into and/or read out from the first volatile memory section 21 and information is output thereon by the decode circuit shown in FIG. 2. The word line TRIM_WL(I) is activated when trimming information is written with respect to the second volatile memory section 23 and information is output thereon by the decode circuit shown in FIG. 3.

The decode circuit shown in FIG. 2 is provided with three NAND gate circuits (N110 to N130), to which an inversion signal of pre-charge signal PREC indicating a pre-charge state at a high-level and an address decode signal SEL_S(I) are individually input. Further, the selection signal SEL_WP is input to the NAND gate circuits N110 and N130, while an inversion signal of the selection signal SEL_WP is input to the NAND gate circuit N120. In addition, power-on signal POR which is at a high level at power-on is also input to the NAND gate circuit N110. Also, a verify signal VERIFY indicating a verify operation when rewrite is executed on the non-volatile memory cell MC on the non-volatile memory section 11 and a match signal MATCH output in a case where an expected write value is in agreement with the stored information as determined by the verify operation are input into the NAND gate N140 and inverted by the inverter gate to give an AND operation signal, which is input to the NAND gate circuit N130. Output signals from the NAND gate circuits N110 to N130 are input into the NAND gate circuit N150.

Low-level output signals are output from these NAND gate circuits N110 to N130 when all of the input signals are at a high level. When at least one of the output signals from the NAND gate circuits (N110 to N130) is at a low level, a high-level signal is transferred from the NAND gate circuit N150 to the word line SRAM_WL(I).

In order to activate any of the NAND gate circuits N110 to N130 and output a low-level signal, it is necessary that an inversion signal of the pre-charge signal PREC input into each of the NAND gate circuits N110 to N130 is at a high level. Namely, the pre-charge signal PREC is required to be at a low level. The operation is therefore only executed in a non-pre-charge state.

Where the address decode signal SEL_S(I) output from the pre-decode circuit described later (FIG. 4) and the selection signal SEL_WP specifying the write-protect information are both at a high level when supply voltage is supplied on the NAND gate circuit N110 at a high level for the power signal POR, low-level output signals are output after activation. Therefore, the word line SRAM_WL(I) is activated at a high level via the NAND gate circuit N150.

In the first volatile memory section 21, the selection switches SLA(j) and SLB(j) are conducted in response to the selection signal SEL_WP, and the word line SRAM_WL(I) is also activated at a high level in response to the address decode signal SEL_S(I). Then, the write-protect information is written into the memory circuit C(I, j) (I=0 to 7) via the corresponding selection switch pair of SA(I, j) and SB(I, j) (I=0 to 7).

The NAND gate circuit N110 will read out the write-protect information from the non-volatile memory section 11 previously stored during power-on so as to operate at the time of writing into the corresponding memory circuit of the first volatile memory section 21.

When the selection signal SEL_WP is at a low level and the address decode signal SEL_S(I) is at a high level, the NAND gate circuit N120 is activated to output low-level signals. Therefore, the word line SRAM_WL(I) is activated at a high level via the NAND gate circuit N150.

Accordingly, the selection signal SEL_WP is kept at a low level and the selection switches SLA(j) and SLB(j) are kept non-conductive in the first volatile memory section 21. Namely, no write-protect information is transferred from the non-volatile memory section 11 to the first volatile memory section 21. Meanwhile, the word line SRAM_WL(I) is activated at a high level depending on the address decode signal SEL_S(I), and the write-protect information stored in the memory circuit C(I, j) (i=0 to 7) is read out to the bit line pairs of B(j) and /B(j) via the corresponding selection switch pairs of SA(I, j) and SB(I, j) (I=0 to 7). As illustrated in FIG. 5 (to be described later) wherein bit line groups BL(J) (J=0 to 15) have a bit width of 16 bits, any one pair of the bit line pairs of B(J) and /B(J) is selected and an output depending on the selection signal SEL_G(J) is decoded by the address signals SA(0) to SA(3). The write protect signal WPP is output by wired-or. The address signals SA(0) to SA(3) shown in FIG. 5 together with address signals SA(4) to SA(6) are addresses inputted from external to the non-volatile memory device during a time of rewritable access that indicate the region of non-volatile memory cells where the write protect function is set.

The NAND gate circuit N120 is operated at the time of reading out the write-protect information stored in the first volatile memory section 21 in order to judge whether or not non-volatile memory cells to be rewritten are memory cells in a region where the write protect is set in a portion of the non-volatile memory cell array to which users have rewritable access while the non-volatile memory device is active after power-on.

The NAND gate circuit N130 will operate at the time when the write-protect information stored in the non-volatile memory section 11 is changed while the non-volatile memory device is active. In changing the information stored in the non-volatile memory section 11, the selection signal SEL_WP is at a high level, the non-volatile memory cell MC is selected and the verify signal VERIFY is also at a high level, by which the verify operation is executed according to the rewritable operation. The information stored in the non-volatile memory cell MC to be rewritten is read out to make a comparison with an expected value to be rewritten, based on the judgment which is made as to whether the rewritten operation is completed or not. The high-level match signal MATCH is output when the rewritten operation is judged to have been completed. In the NAND gate N140, output signals are activated by the selected address decode signal SEL_S(I) and sent out at a low level, in addition to the high-level verify signal VERIFY and the high-level match signal MATCH. Therefore, the word line SRAM_WL(I) is activated at a high level via the NAND gate circuit N150.

In the first volatile memory section 21, the selection switches SLA(j) and SLB(j) are rendered conductive in response to the selection signal SEL_WP, and the word line SRAM_WL(I) is activated at a high level depending on the address decode signal SEL_S(I), by which the write-protect information is written into the memory circuit C(I, j) (I=0 to 7) via corresponding selection switch pairs, SA(I, j) and SB(I, j) (I=0 to 7).

When the non-volatile memory device is active after power-on, the NAND gate circuit N130 will read out the write-protect information changed according to the change in the write-protect information to the non-volatile memory section 11 and will transfer the information also to the first volatile memory section 21, operating so as to conform the content of the non-volatile memory section 11 with that of the first volatile memory section 21.

In the decode circuit shown in FIG. 2, the NAND gate circuits N110 and N130 are configured so as to execute the function of decoding a write site for writing into the first volatile memory section 21 the write-protect information read out from the non-volatile memory section 11, whereas the NAND gate circuit N120 is configured so as to provide a decode function for reading out the write-protect information according to an address input thereby when rewritable access to the non-volatile memory device is active (i.e., rewritable access to the portion of the non-volatile memory cell array to which users have access).

The decode circuit shown in FIG. 3 is provided with two NAND gate circuits N100 and N102, to which the selection signal SEL_TR selected at a high level and the Y decode signal SEL_Y(I) are respectively input. Further, power-on signal POR is input into the NAND gate circuit N100, and the verify signal VERIFY and the match signal MATCH are input into the NAND gate N101 and inverted by the inverter gate to provide an AND operation, the result of which is input into the NAND gate circuit N102. Output signals from the NAND gate circuit N100 and N102 are input into the NAND gate circuit N103.

When all of the input signals are at a high level, low-level output signals are output from the respective NAND gate circuits N100 and N102. When at least one of the output signals from the NAND gate circuit N100 and N102 is at a low level, a high-level signal is output from the NAND gate circuit N103 to activate the word line TRIM_WL(I).

When the Y decode signal SEL_Y(I) output from the pre-decode circuit to be described later (FIG. 4) and the selection signal SEL_TR which specifies the trimming information are both at a high level during actuation of supply voltage to keep power-on signal POR at a high level, the NAND gate circuit N100 is activated to output a low-level output signal. Therefore, the word line TRIM_WL(I) is activated at a high level via the NAND gate circuit N103.

In the second volatile memory section 23, the word line TRIM_WL(I) is activated at a high level in response to the Y decode signal SEL_Y(I), by which the trimming information is written into the latch circuit L (I, j) (I=0 to 7) via the corresponding write selection switch S1 (I, j) (I=0 to 7).

The NAND gate circuit N100 will read out the trimming information from the non-volatile memory section 11 previously stored during power-on, thereby writing the information into the corresponding latch circuit of the second volatile memory section 23.

The NAND gate circuit N102 will operate when the trimming information stored in the non-volatile memory section 11 is changed while the non-volatile memory device is active. In changing the information stored in the non-volatile memory section 11, the writing operation and the verify operation are repeated until the information stored is in agreement with the expected value. The selection signal SEL_TR is at a high level and the non-volatile memory cell MC is selected. The output signal is activated by the selected Y decode signal SEL_Y(I) which is stored and output at a low level along with the high-level verify signal VERIFY and the high-level match signal MATCH in the NAND gate N101. In this manner, the word line TRIM_WL(I) is activated at a high level via the NAND gate circuit N103.

In the second volatile memory section 23, the word line TRIM_WL(I) is activated at a high level in accordance with the Y decode signal SEL_Y(I), and the trimming information is written into the latch circuit L(I, j) (I=0 to 7) via the corresponding write-selection switch S1(I, j) (I=0 to 7).

When the non-volatile memory device is active after power-on, the NAND gate circuit N102 will read out the trimming information changed according to the change in the trimming information to the non-volatile memory section 11, and will also transfer the information to the second volatile memory section 23, thereby conforming the content of the non-volatile memory section 11 with that of the second volatile memory section 23. The trimming information changed in the non-volatile memory section 11 is used by vendors for a special testing process.

In the decode circuit shown in FIG. 3, the NAND gate circuits N100 and N102 are both configured so as to execute the function of decoding a write site for writing the trimming information read out from the non-volatile memory section 11 into the second volatile memory section 23. The decode circuit shown in FIG. 3 is not provided with the configuration corresponding to that of the NAND gate circuit N120 in the decode circuit shown in FIG. 2. The second volatile memory section 23 is configured so as to constantly output the trimming information from the latch circuit L(I, j) via the inverter gate when the trimming information is written from the non-volatile memory section 11, thereby eliminating the need for the trimming information to be individually selected and read out.

FIG. 4 illustrates a pre-decode circuit example for outputting the Y decode signal SEL_Y(I) and the address decode signal SEL_S(I). The NAND gate circuit N200 in which the respective logic combinations of three bit address signals SA(4) to SA(6) are input in response to the address assignment as shown in FIG. 5 are used to decode the address signals SA(4) to SA(6) and output low-level signals. The selection signals SEL_WP and SEL_TR are input into the NOR gate N202 and, when either of the selection signals is at a high level, a low-level signal is output. An output signal of the NAND gate circuit N200 and that of the NOR gate circuit N202 are input into the NAND gate circuit N204. The Y decode signal SEL_Y(I) is output as a high-level signal from NAND gate circuit N204, when decoded. The output of the NAND gate circuit N200 is input also into the inverter circuit N205 to output the address decode signal SEL_S(I). The output Y decode signal SEL_Y(I) and the address decode signal SEL_S(I) are processed by the decode circuits shown in FIG. 2 and FIG. 3.

FIG. 5 shows a table of the address assignments for storing the write-protect information and the trimming information in the non-volatile memory section 11 and in the first/second volatile memory sections 21/23 and also for providing the identification information when reading out the information from the first volatile memory section 21. The write-protect information will be identified by address signals SA(0) to SA(6) indicating basic regions for setting the write protect function, such as sectors, with various types of address information corresponding to non-volatile memory cells to be rewritten. The trimming information will be identified by the address information of the non-volatile memory cell MC when stored in the non-volatile memory section 11.

FIG. 5 depicts a case where the 16-bit wide bit line group BL(I) is configured at 8 pairs (M=8) under the condition of N=16. Identification information from 0 to 127 identified by 16×8=128 is identified by 3-bit address signals of address signals SA(4) to SA(6). The bit line group BL(I) is determined in response this identification. Transfer from the non-volatile memory section 11 is executed by the 16-bit wide data line DB for each bit line group (I). Therefore, as shown in FIG. 4, the Y decode signal SEL_Y(I) and the address decode signal SEL_S(I) obtained by decoding the address signals SA(4) to SA(6) are used to write the write-protect information/trimming information read out from the non-volatile memory section 11 into the first/second volatile memory sections 21/23.

Further, 4-bit address signals of address signals from SA(0) to SA(3) are used to identify individual bits in the 16-bit wide bit line group BL(I). These signals are required when information on individual bits is necessary. When specific write-protect information is read out from the first volatile memory section 21 in accordance with rewritable access to the non-volatile memory cell array to which users have access externally, it is necessary to decode the address signals SA(0) to SA(3) in addition to the address signals SA(4) to SA(6). The write-protect information is decoded by the address decode signal SEL_S(I) and also by the selection signal SEL_G(J) and read out.

Figure 6:
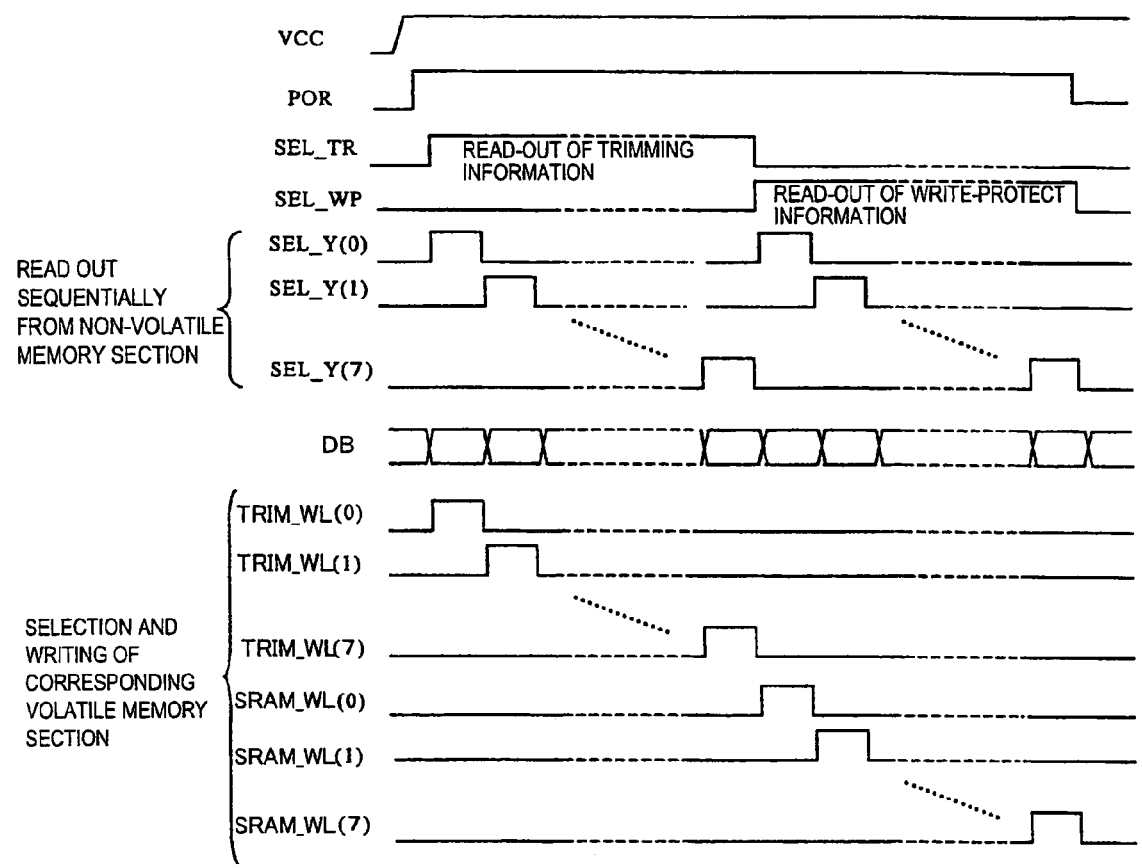
FIG. 6 is a timing chart for transferring operational information from non-volatile memory section in response to power-on in accordance with the present embodiment.

FIG. 6 shows a timing chart used when the trimming information and the write-protect information are read out from the non-volatile memory section 11 in response to power-on and written into the corresponding second volatile memory section 23 and the first volatile memory section 21. Power-on signal POR is at a high level when various types of the operational information such as the trimming information stored in the non-volatile memory section 11 and the write-protect information are stored in the second volatile memory section 23 and the first volatile memory section 21, in response to power-on of the non-volatile memory device. When power is turned on, initially, the selection signal SEL_TR is at a high level and the trimming information is read out to the bit lines from the non-volatile memory cells MC connected to the selection signal SEL_TR. Thereafter, Y decode signals SEL_Y(I) (I=0 to 7) are sequentially selected, by which the trimming information read out to the corresponding bit line group BL (I) is read out to the internal data lines DBI, amplified by the sense amplifier 19 and read out to the data lines DB. Since word lines TRIM_WL(I) are sequentially kept at a high level and selected depending on the Y decode signal SEL_Y(I), the trimming information is written into the corresponding latch circuits L(I, j) in the second volatile memory section 23.

When the Y decode signal SEL_Y(I) is completely selected and the trimming information is written into the second volatile memory section 23, the selection signal SEL_TR is at a low level, and the selection signal SEL_WP is at a high level. Similarly, the write-protect information is read out to the bit lines from the non-volatile memory cells MC. Y decode signals SEL_Y(I) (I=0 to 7) are sequentially selected and the write-protect information read out to the corresponding bit line group BL(I) is read out to the data lines DB from the internal data lines DBI through the sense amplifier 19. Since the word lines SRAM_WL(I) are sequentially kept at a high level and selected depending on the address decode signal SEL_S(I), the write-protect information is written into the corresponding memory circuits C(I, j) of the first volatile memory section 21.

Figure 7:
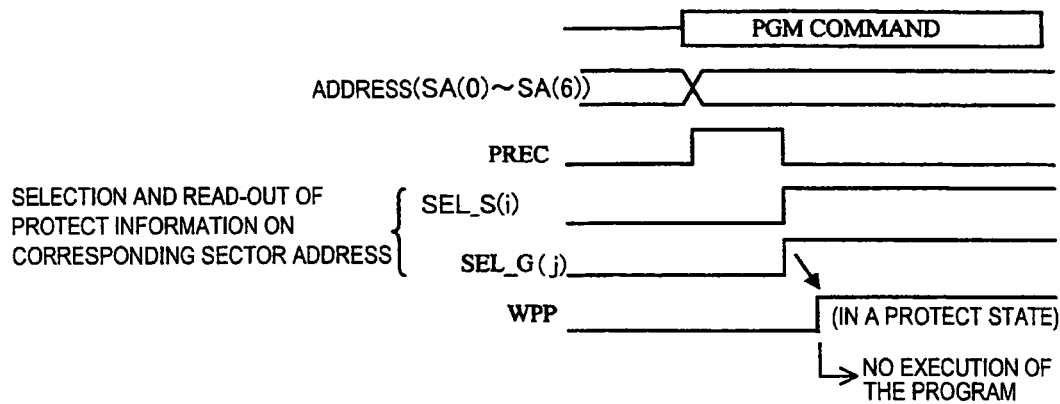
FIG. 7 is a timing chart for reading out write-protect information in operating programs of sectors which are write-protected in accordance with the present embodiment.
Figure 8:
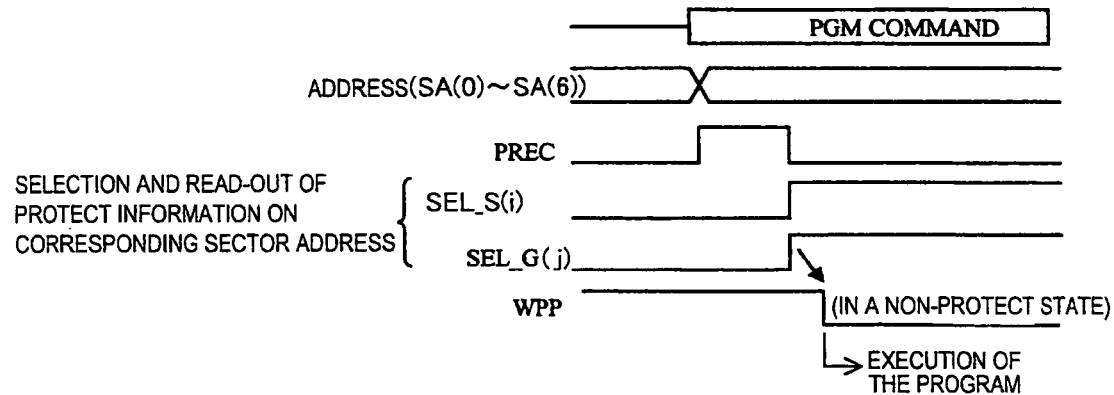
FIG. 8 is a timing chart for reading out the write-protect information in operating programs of sectors which are not write-protected in accordance with the present embodiment.
Figure 9:
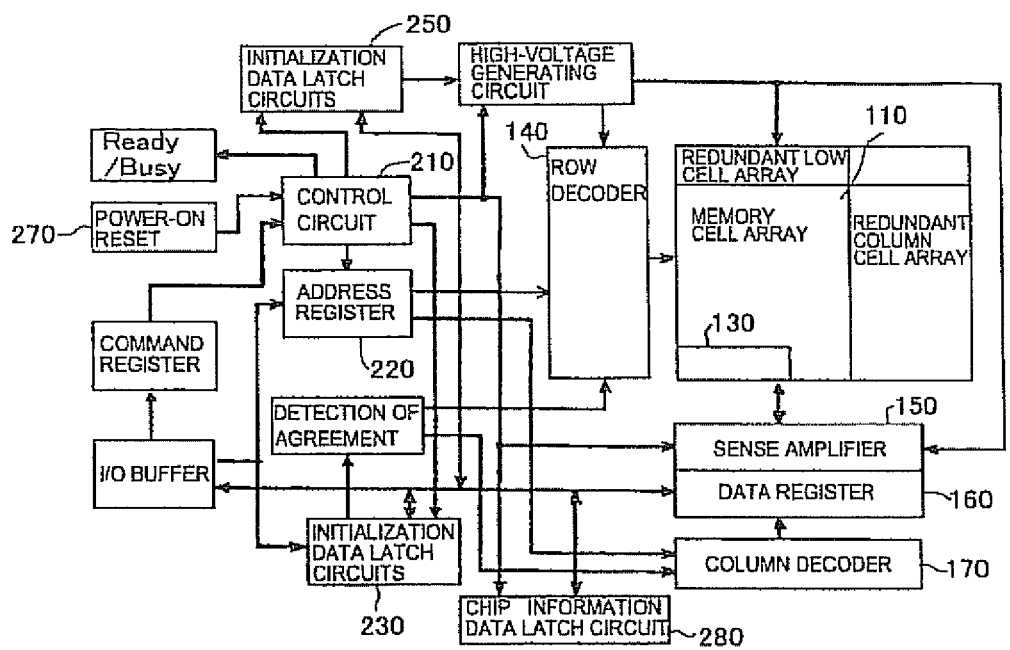
FIG. 9 is a circuit diagram of a conventional semiconductor non-volatile memory device in accordance with Patent Document 1.
Figure 10:
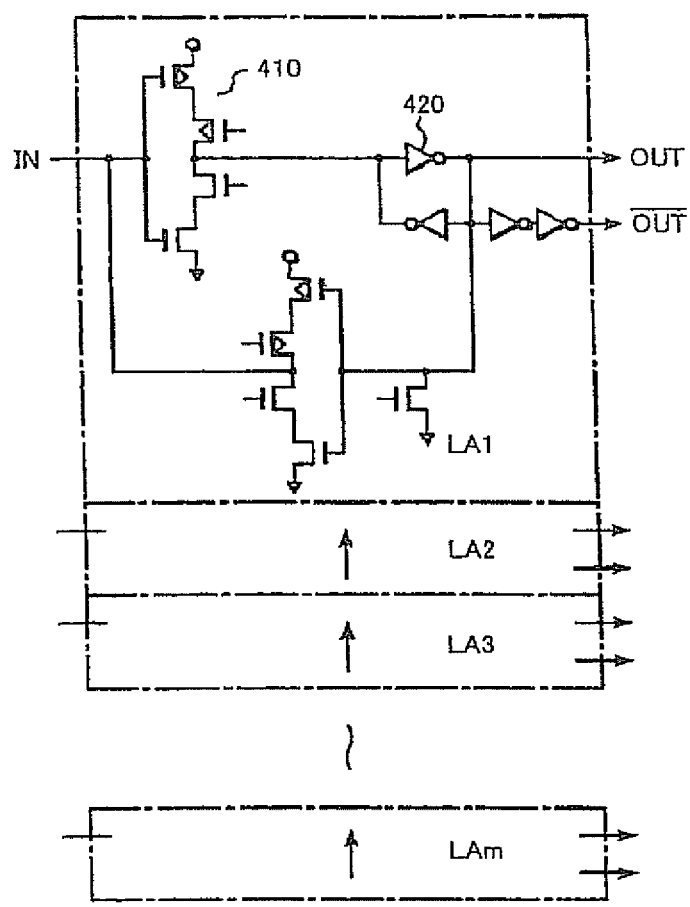
FIG. 10 illustrates data latch circuits of the semiconductor non-volatile memory device in accordance with Patent Document 1.

FIGS. 7 and 8 show timing charts for accessing the write-protect information for confirmation of write-protect status when program a command is received for rewritable access operations on portions of the non-volatile memory cell array to which users have access. FIG. 7 shows the case where the write-protect information indicates that the portion of the non-volatile memory cell array is in a write-protect state, and FIG. 8 shows the case where the write-protect information indicates that the portion of the non-volatile memory cell array is in a non write-protect state.

Addresses of the non-volatile memory cells to be programmed are input in association with input of the program command. After the pre-charge signal PREC is at a high level and the pre-charge operation is executed. Thereafter, the input addresses and address signals SA(0) to SA(6) are decoded. Address signals SA(0) to SA(6) indicate a memory cell region(s), such as a sector, for which the write-protect function is set. The address decode signal SEL_S(I) and the selection signal SEL_G(J) are then selected in response to the decoded input addresses and the decoded address signals. In accordance with the selected address decode signals SEL_S(I) and selection signal SEL_G(J), the write-protect information is read out from the first volatile memory section 21 to output the write protect signal WPP. If the output write-protect signal WPP is at a high level indicating a protect state (as shown in FIG. 7), no program operation is executed. If the output write-protect signal WPP is at a low level indicating a non-protect state (as shown in FIG. 8), the program operation is executed.

As apparent from the explanation above, according to the present embodiment, a preferred volatile memory section can be selected depending on the mode of operational information to be retrieved from the first volatile memory section 21 or the second volatile memory section 23, the volatile memory sections being different in read-out characteristics for information stored in the volatile memory section while the non-volatile memory device is in an active state. Namely, the memory section may be provided in accordance with the operational state. The second type of operational information such as the write-protect information can be stored in the first volatile memory section 21, which is read out in response to identification information such as the address corresponding to and linked with each portion operational information. The first type of operational information, such as the trimming information and the redundant address information, that must be constantly referenced during circuit operation can be stored in the second volatile memory section 23 which is continually output in a logically processible form.

Further, since the first volatile memory section 21 is configured so as to output the operational information selected in response to the identification information, it is necessary only to have an electric current-driving capacity only for storing the identification information in the volatile memory and it is therefore not required to have an electric current-driving capacity necessary for storing the operational information while being able to logically process the operational information. Control circuits and driving circuits such as output circuits necessary for reading out the selected operational information may be commonly used. Thus, the first volatile memory section 21 can be designed utilizing compact-sized circuits and can be configured to store a large volume of operational information.

The second volatile memory section 23 outputs the operational information therefrom in such a way that logical processing can be constantly provided after a sufficient electric current-driving capacity is secured. Therefore, when the non-volatile memory device is accessed, the operational information from the second volatile memory section 23 is continuously available to execute internal operations. Since no prior processing such as amplification or waveform shaping is required for the operational information utilized from the second volatile memory section 23, such operational information can be accessed at high speeds.

In accordance with the present invention, the non-volatile memory device is provided with the non-volatile memory section 11 in the non-volatile memory cell array, separate from regions of the non-volatile memory cell array to which users have access. It is preferable that the operational information should be predefined in the non-volatile memory section 11, thereby retaining the operational information after power-off. It is also preferable that the operational information stored in the non-volatile memory section 11 is transferred to the first volatile memory section 21 and the second volatile memory section 23 in response to detection of power-on, initialization and/or a change in the operational information stored in the non-volatile memory section, thereby making it possible to conform the operational information stored in the non-volatile memory section 11 with the operational information stored in the volatile memory sections 21 and 23 which is used in internal operations.

Further, in the first volatile memory section 21, memory cells for writing operations and read-out operations are selected from the volatile memory cells depending on address information, which is an example of identification information. The first volatile memory section 21 is provided with a RAM configuration having a predetermined number of bit line pairs B(j) and /B(j) (an example of a pair of common digit lines to be commonly connected) for each memory cell. Here, it is preferable that the write-protect information stored in the memory cells should be read out via the bit line pair of B(j) and /B(j) from memory cells selected in response to the input address. Therefore, a large volume of information can be stored in a compactly configured circuit and can be read out whenever necessary.

In accordance with the embodiment described hereinabove, the memory cells are also provided with the memory circuit C(i, j) configured with latch circuits and the selection switch pair of SA(i, j) and SB(i, j) which are selected depending on the input address and connection control of the memory circuit C(i, j) with the bit line pair of B(j) and /B(j). The selection switch pair of SA(i, j) and SB(i, j) are one example of a selection switch section in accordance with the present invention. Therefore, the above-described array configuration can be applied as an example of the first volatile memory section 21.

Also, the write-protect information transferred in response to power-on, initialization and/or a change in the operational information stored in the non-volatile memory section is written via the bit line pair of B(j) and /B(j) and the selection switch pair of SA(i, j) and SB(i, j) in response to the input address.

In addition, the address linked with the operational information stored in the first volatile memory section 21 is set depending on an external access operation by which the write-protect information can be selected with respect to memory cells for rewrite access.

Further, the second volatile memory section is written by the latch circuit L(i, j) and the write-selection switches S1(i, j) and S2(i, j). The write-selection switch S1(i, j) controls the propagation of the trimming information to the latch circuit L(i, j) and the write-selection switch S2(i, j) functions to latch the low-level trimming information with high speed and accuracy in accordance with the low-level compensating switch S3(i, j).

The trimming information stored in the second volatile memory section 23 is defined as the identification information that the address specifies as the non-volatile memory cell MC to be accessed when stored in the non-volatile memory section 11.

All the operational information stored in the non-volatile memory section 11 is transferred to either the first volatile memory section 21 or the second volatile memory section 23 depending on the attributes of the operational information in response to power-on, initialization and/or a change in the operational information stored in the non-volatile memory section. It is also possible to store the operational information in response to the attributes of the information.

The present invention, of course, is not limited to the above-described embodiments but may be improved or modified in various ways within a scope not deviating from the object of the present invention.

For example, an explanation was made by referring to the trimming information as an example of the first type of operational information and also referring to the write-protect information as an example of the second type of operational information. As recognized by those skilled in the art, the present invention is not limited thereto. It may also be preferable to store the redundant address information in the second volatile memory section 23 as the first type of operational information, in place of the trimming information or in conjunction with the trimming information. It may also be preferable to store the security information such as read protect information, read-out restriction information and designated code information for giving read-out permission in the first volatile memory section 21 as the second type of operational information, in place of the write-protect information or in conjunction with the write-protect information.

In accordance with the present invention, the non-volatile memory section in which the operational information is stored can be configured with a non-volatile memory cell structure similar in structure to a memory cell array of the non-volatile memory device which is an address space as a memory region requested by users. In this case, the non-volatile memory section may be arranged in the same region where the memory cell array of the non-volatile memory device is located or in a different region. The same region means having, for example, a common well region. A common region arrangement can eliminate the necessity for providing a border region of the memory cell array between the non-volatile memory section and the non-volatile memory device, thereby making it possible to arrange them in a compact area without waste of semiconductor die surface area. Further, non-volatile memory cells of the non-volatile memory section and those of the memory cell array can be provided with a configuration in which the bit line and/or word line are provided separately or commonly. A separate configuration makes it possible that the non-volatile memory section and the memory cell array are mutually independent and have parallel access, or makes it possible to renew the operational information to the non-volatile memory section without interrupting an access operation to the memory region accessible by ordinary users. On the other hand, a common configuration makes it possible that row/column decoders and read-out/rewriting control sections can be provided commonly on the non-volatile memory section and the memory cell array to improve the degree of integration.

In addition, a two-stage memory configuration in which the non-volatile memory device is provided with the non-volatile memory section and the volatile memory section may have the following characteristics: A computer system is configured with a different object from a cache system, which is a multi-layered memory configuration made with main memory and cache memory, thereby providing different actions and effects. It is generally understood that the main memory is configured with memories such as a DRAM and the cache memory is configured with memories such as a SRAM. In general, they are configured with volatile memories.

The multi-layered memory system in a computer system is configured for providing high-speed memory access. A certain region of the main memory is equipped with a cache memory such as a SRAM which is able to provide high-speed access, and read-out/writing operations are performed at high speeds in the cache memory. Data is read out at an appropriate timing from the new data region of the main memory to the cache memory and the content of the cache memory is written into the main memory, according to movement in an access region or until a predetermined level of utilized cache memory is reached. Further, if the cache memory coincides with the retained address space at the time of request for access from outside of the memory device, the cache memory is connected to an external I/O to provide high-speed access. Therefore, the cache memory is connected to the external I/O.

In contrast, the two-stage memory configuration provided with the non-volatile memory device has the separate or additional characteristics.

For example, there may be a case where a non-volatile memory section is provided in order to retain the operational information after power-off but access speed on the non-volatile memory section is unable to provide a sufficient circuit operation because a high-speed operation is required during power-on. Therefore, a volatile memory section is provided to assist the limited access speed on the non-volatile memory section. Namely, a two-stage memory configuration is provided which comprises a non-volatile memory section for allowing the operational information to be retained after power-off and a volatile memory section for allowing provision of the operational information to internal circuits by high speed operation during power-on.

Also, the same operational information is stored in the non-volatile memory section, regardless of whether the device is in a power-on state or a power-off state, and the information is transferred to the volatile memory section after power-on and used so that the operational information of the volatile memory section can be used to determine the operating condition of circuit operations. Therefore, the non-volatile memory section in which the operational information is stored has the same memory capacity as the volatile memory section in which the operational information is stored.

In addition, the flow of operational information when the operational information is newly set or updated is fixed in such a way that the information is stored in the volatile memory section after being stored in the non-volatile memory section. A rewriting time required for writing the operational information into the non-volatile memory section (which is a physical property of data memory, such as electric charge injection and release to a floating gate of a non-volatile memory cell) may require a longer time than a rewriting time for writing the operational information into the volatile memory section (which is an electrical property). According to a flow in a direction of the setting or update in accordance with the present invention, the setting or updated operational information of the volatile memory section is advantageously applied to circuit operations after completing storage in the non-volatile memory section in compliance with the above setting or unidirectional flow of the update, eliminating the period when the content of the non-volatile memory section is not in conformity with that of the volatile memory section, thereby preventing incorrect or deviant circuit operations. Since the setting is made or unidirectional flow of update is executed as described above, the volatile memory section is not connected to an external I/O and all the information on setting or update of the volatile memory section is received from the non-volatile memory section. Therefore, the internal circuits which require the operational information receive the operational information from the volatile memory section, not from the non-volatile memory section.

A computer system differs in that it is provided with a two-stage memory configuration of a non-volatile memory section and a volatile memory section from that of the cache system provided with two memories which are both volatile. It also differs from the cache system in that the computer system has the same memory capacity between the non-volatile memory section and the volatile memory section whereas the cache system has the cache memory in a certain region of the main memory. Further, it also differs from the cache memory in that, in the computer system, a flow of the setting or updated operational information is fixed in the direction from the non-volatile memory section to the volatile memory section whereas, in the cache system, the information is transferred in a mutual direction between the main memory and the cache memory. It again differs from the cache system in that, in the computer system in accordance with the present invention, the non-volatile memory section is connected to the external I/O and the volatile memory section is not connected to the external I/O whereas, in the cache system, the cache memory is connected to the external I/O.

Latch circuits and register circuits of the second volatile memory section 23 are arranged in a peripheral circuit region where a circuit block is arranged which is configured with logical control circuits for controlling the memory cell array of the non-volatile memory device. Elements of the peripheral circuit region are given a layout pattern whose line width and space width are wider than those of the memory cells. This is because the memory cells are provided with redundant functions, whereas the logical control circuitry is not provided with the redundant functions. Therefore, the latch circuits and register circuits in accordance with the present invention are also given a layout whose line width and space width are wider than those of the memory cells.

The first volatile memory section 21 having the above-described array configuration is also arranged in the peripheral circuitry and equipped with a randomly accessible function by addressing of the identification information, thereby providing a control method for giving access only when the second type of operational information is required.

It is further preferable that the above-described array configuration have a layout pattern designed in more minute detail than that of the second volatile memory section 23 (which is substantially equal to the memory cell array of the non-volatile memory device). It is also sufficient that the transistor elements are substantially equal to the memory cell array in capacity. Since the bit number of the operational information is much smaller than the number of the non-volatile memory cells to which users have access, it is practically unnecessary to provide the redundant function with the SRAM in view of defect density. Arrangement of the first volatile memory section 21 having the above-described array configuration on a peripheral circuit makes it possible to access the operational information at a higher speed for a circuit which requires the second type of operational information, thereby reducing the die size due to a much smaller element region than the latch circuit and the register circuit which are wider in line width and space width.

Figure 11:
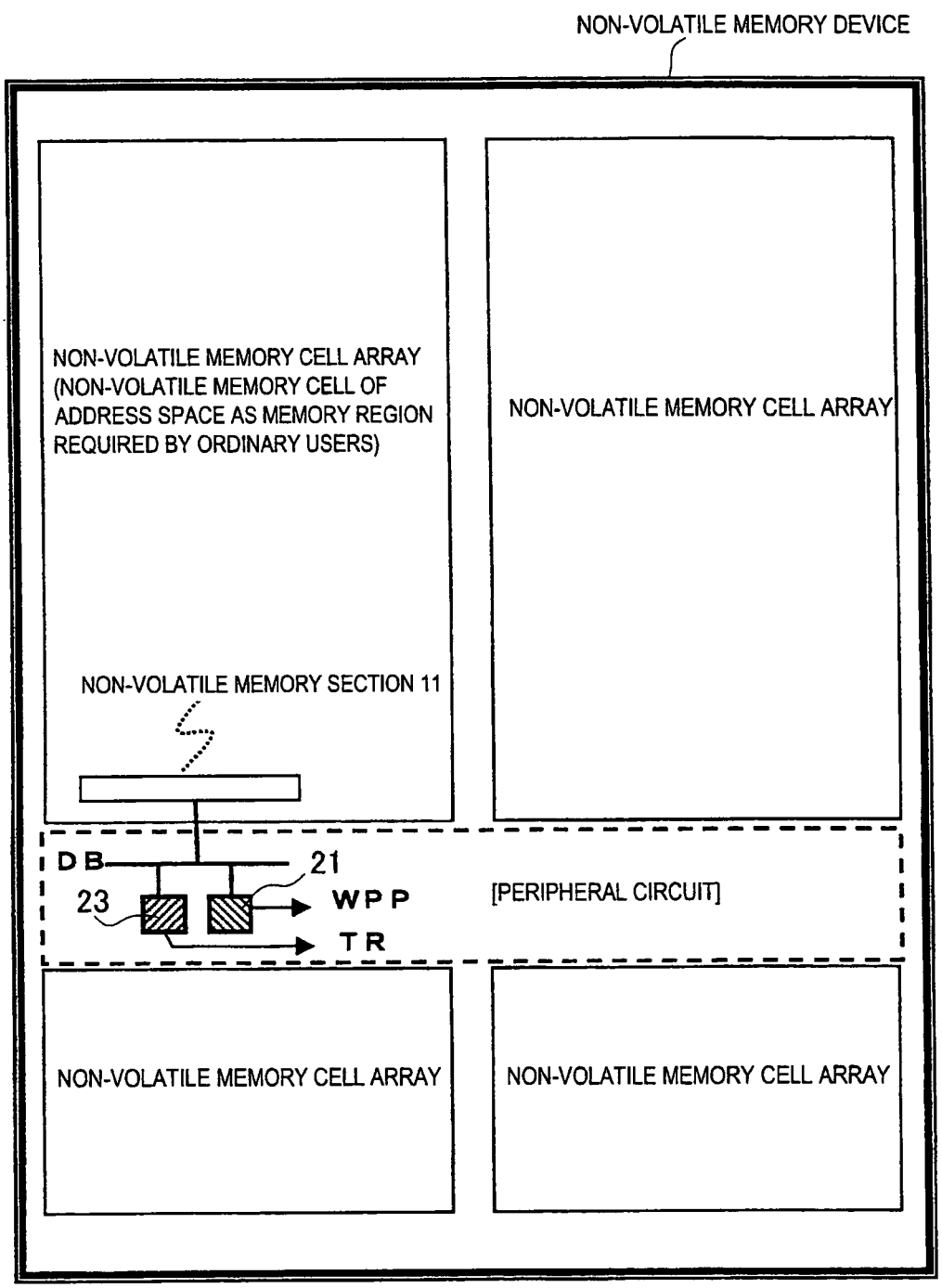
FIG. 11 illustrates the non-volatile memory device in accordance with the present embodiment.

FIG. 11 illustrates an example of a non-volatile memory device in accordance with the present invention. The non-volatile memory cell array, which is comprised of non-volatile memory cells with the address spaces assigned to memory regions accessible by ordinary users is provided with a four-bank configuration, and the non-volatile memory section 11 is arranged within any one of the four banks. The first volatile memory section 21 and the second volatile memory section 23 are arranged inside the peripheral circuit, and the output signal WPP of the first volatile memory section 21 and the output signal TR of the second volatile memory section 23 are input into the control circuit within the peripheral circuitry. The non-volatile memory section 11, the first volatile memory section 21 and the second volatile memory section 23 are connected with the data line DB. The internal data line DBI and the sense amplifier are omitted from FIG. 11, but as would be apparent to those skilled in the art, could also be configured in the peripheral circuitry. As described above, the first volatile memory section 21 is arranged inside the peripheral circuitry region but configured in line width and space width smaller than those of the layout pattern of other transistor elements and wiring of the peripheral circuitry. Preferably, it is configured in line width and space width similar to those of the non-volatile memory section 11.

Finally, rewriting of the non-volatile memory cell MC may include a program operation or an erasing operation. Such rewriting operation is executed by changing the threshold voltage of the non-volatile memory cell, for example, physical phenomena such as electric charge release/injection to the floating gate of the non-volatile memory cell MC and Fowler-Nordheim tunneling/hot electron phenomena. However, the rewriting of the present invention is not limited thereto.

What is claimed is:

1. A non-volatile memory device comprising:
an array of non-volatile memory cells which stores a first and second operational information for the non-volatile memory device, wherein the first and second operational information are different; and
a volatile memory section which stores the first and second operational information only while power is being supplied to the non-volatile memory device, wherein the volatile memory section comprises:
a first volatile memory section having an array configuration from which the first operational information stored therein with address assignment is read out in response to individual address selections, the addresses linked with corresponding portions of the first operational information, wherein updated first operational information is stored in the array of non-volatile memory cells before the first volatile memory section is updated; and
a second volatile memory section, having a latch circuit configuration, comprising one or more latch circuits, and allowing immediate access to the second operational information stored therein in response to power-on, wherein the second volatile memory section constantly and repetitiously outputs in logically processable form all the second operational information stored therein.

2. A non-volatile memory device according to claim 1 further comprising a sense amplifier coupled to the volatile memory section, wherein the array of non-volatile memory cells includes a non-volatile memory section which stores the first and second operational information and is coupled to the sense amplifier, and wherein the sense amplifier reads the first and second operational information from the non-volatile memory section and provides the first and second operational information read therefrom to the first volatile memory section and the second volatile memory section in response to detection of power-on, initialization and/or a change of the first and second operational information stored in the non-volatile memory section.

3. A non-volatile memory device according to claim 1, wherein the address assignment linked with the corresponding portions of the first operational information comprises address information defined in response to an internal operation which requires the corresponding portions of the operational information.

4. A non-volatile memory device according to claim 3 further comprising a sense amplifier coupled to the volatile memory section, wherein the array of non-volatile memory cells includes a non-volatile memory section which stores the first and second operational information and is coupled to the sense amplifier, and wherein the sense amplifier reads the first operational information to be stored in the first volatile memory section from the non-volatile memory section and provides the first operational information read therefrom to the first volatile memory section in response to detection of power-on, initialization and/or a change of the first operational information stored in the non-volatile memory section.

5. A non-volatile memory device according to claim 1, wherein the first volatile memory section comprises:
a plurality of memory cells in the array configuration for storing the operation information, each of a predetermined number of the plurality of memory cells selectable in response to the address assignment; and
at least one common digit line commonly coupled to each of the predetermined number of the plurality of memory cells, and wherein the operational information stored in the plurality of memory cells is read out from the plurality of memory cells by being selected in response to the address assignment and provided on the at least one common digit line.

6. A non-volatile memory device according to claim 5, wherein each of the plurality of memory cells comprise:
a memory section which stores the operational information; and
a selection switch section which is activated in response to the address assignment to connect the memory section to the at least one common digit line.

7. A non-volatile memory device according to claim 6, wherein the array of non-volatile memory cells includes a non-volatile memory section which stores the first and second operational information in response to the address assignment, and wherein in response to power-on, initialization and/or a change of the first operational information stored in the non-volatile memory section the selection switch section connects the at least one common digit line to the first volatile memory section, thereby writing the first operational information from the non-volatile memory section to the first volatile memory section through the at least one common digit line.

8. A non-volatile memory device according to claim 1, wherein the address assignment linked with the operational information to be stored in the first volatile memory section is defined in response to an external access operation.

9. A non-volatile memory device according to claim 8, wherein the first operational information to be stored in the first volatile memory section comprises security information.

10. A non-volatile memory device according to claim 8, wherein the first operational information to be stored in the first volatile memory section comprises write protect information, and wherein the address assignment is defined in accordance with address information which designates a region of the array of non-volatile memory cells subject to write protect control.

11. A non-volatile memory device according to claim 1, further comprising a non-volatile memory section which stores the first and second operational information, and wherein the second volatile memory section comprises:
a latch section comprising the one or more latch circuits in which the second operational information is stored; and
a write-selection switch section which operably connects the latch section and the non-volatile memory section.

12. A non-volatile memory device according to claim 11, wherein the second operational information is stored in the non-volatile memory section, and wherein in response to detecting power-on, initialization and/or a change of the second operational information stored in the non-volatile memory section, the write-selection switch section connects the non-volatile memory section to the second volatile memory section for writing the second operational information from the non-volatile memory section into the second volatile memory section.

13. A non-volatile memory device according to claim 1, wherein all of the first and second operational information stored in the non-volatile memory section is transferred to either the first volatile memory section or the second volatile memory section in response to detection of power-on, initialization and/or a change of the first or second operational information stored in the non-volatile memory section.

14. A non-volatile memory device according to claim 1, wherein the first and second volatile memory sections are arranged on a peripheral circuit region.

15. A non-volatile memory device according to claim 1, wherein the second volatile memory section is arranged by a layout pattern with a second design rule, and wherein the first volatile memory section is arranged by a layout pattern with a first design rule finer than the second design rule by which the second volatile memory section is arranged.

16. A non-volatile memory device according to claim 1, wherein a transistor device of a memory cell of the first volatile memory section is smaller than a transistor device of a memory cell of the second volatile memory section.

17. A non-volatile memory device according to claim 1, wherein the first operational information comprises operational information necessary for executing predetermined internal operations of the non-volatile memory device.

18. A non-volatile memory device according to claim 1, wherein the second operational information comprises operational information necessary for determining the operating conditions of the non-volatile memory device.

* * * * *